United States Patent
Liao et al.

(10) Patent No.: US 9,190,367 B1
(45) Date of Patent: Nov. 17, 2015

(54) SEMICONDUCTOR PACKAGE STRUCTURE AND SEMICONDUCTOR PROCESS

(71) Applicant: ADVANCED SEMICONDUCTOR ENGINEERING, INC., Kaosiung (TW)

(72) Inventors: Kuo Hsien Liao, Kaohsiung (TW); Ming-Chiang Lee, Kaohsiung (TW); Cheng-Nan Lin, Kaohsiung (TW)

(73) Assignee: ADVANCED SEMICONDUCTOR ENGINEERING, INC., Kaosiung (TW)

( * ) Notice: Subject to any disclaimer, the term of this patent is extended or adjusted under 35 U.S.C. 154(b) by 0 days.

(21) Appl. No.: 14/520,914

(22) Filed: Oct. 22, 2014

(51) Int. Cl.
*H01L 23/02* (2006.01)
*H01L 23/00* (2006.01)

(52) U.S. Cl.
CPC ............. *H01L 24/01* (2013.01); *H01L 2224/97* (2013.01); *H01L 2225/1041* (2013.01)

(58) Field of Classification Search
CPC .............. H01L 2924/15; H01L 2221/68313; H01L 2023/4031; H01L 21/67121
See application file for complete search history.

(56) References Cited

U.S. PATENT DOCUMENTS

| | | | |
|---|---|---|---|
| 5,222,014 A * | 6/1993 | Lin | ................................ 361/792 |
| 5,619,399 A * | 4/1997 | Mok | ............................ 361/707 |
| 7,312,518 B2 | 12/2007 | Liao et al. | |
| 7,554,189 B1 | 6/2009 | Li et al. | |
| 7,569,925 B2 | 8/2009 | Nishizawa et al. | |
| 7,656,677 B2 | 2/2010 | Ogawa et al. | |
| 7,820,916 B2 | 10/2010 | Ogawa | |
| 7,851,708 B2 | 12/2010 | Sakai et al. | |
| 8,039,304 B2 | 10/2011 | Pagaila | |
| 8,264,080 B2 | 9/2012 | Pagaila | |
| 8,461,463 B2 | 6/2013 | Kato et al. | |
| 8,592,975 B2 | 11/2013 | Pagaila | |
| 2012/0250265 A1 | 10/2012 | Kawate | |
| 2013/0155639 A1 | 6/2013 | Ogawa et al. | |
| 2014/0048932 A1 | 2/2014 | Pagaila | |

* cited by examiner

*Primary Examiner* — Tuan Nguyen
(74) *Attorney, Agent, or Firm* — Foley & Lardner, LLP; Cliff Z. Liu (57) ABSTRACT

The semiconductor package includes a substrate, a plurality of components, an interposer, an electrical interconnect and a first package body. The substrate has a first surface and a second surface opposite to the first surface. A first component is mounted on the first surface of the substrate, and a second component is mounted on the second surface of the substrate. The interposer has a first surface. The electrical interconnect connects the first surface of the interposer to the second surface of the substrate. The first package body is disposed on the second surface of the substrate and encapsulates the second component, the electrical interconnect and at least a portion of the interposer.

23 Claims, 9 Drawing Sheets

SEMICONDUCTOR PACKAGE STRUCTURE AND SEMICONDUCTOR PROCESS

BACKGROUND

1. Technical Field

The present disclosure relates to a semiconductor package structure and a semiconductor process, and more particularly to a double-sided semiconductor package structure and a manufacturing method thereof.

2. Description of the Related Art

Semiconductor devices have become progressively more complex, driven at least in part by the demand for smaller sizes and enhanced processing speeds. At the same time, there is a demand to further miniaturize many electronic products containing these semiconductor devices. Semiconductor devices are typically packaged, and then may be installed on a substrate that includes electrical circuitry, such as a circuit board. This results in space being occupied by both the semiconductor device package and the substrate, with a surface area on the substrate being occupied by the semiconductor device package. Additional costs may be incurred by performing packaging, board manufacturing, and assembly as separate processes.

Therefore, it would be desirable to reduce the space occupied by a semiconductor device on a substrate, and to simplify and combine the packaging, board manufacturing, and assembly processes as applied to the semiconductor device and the substrate.

Moreover, a radio-emission device, such as a radio frequency (RF) device, may adversely affect the operation of a semiconductor device, and electromagnetic interference (EMI) may easily occur. EMI may interrupt, obstruct, or otherwise degrade or limit the effective performance of a circuit.

Accordingly, it would be desirable to develop a semiconductor package structure to solve the aforesaid problems.

SUMMARY

According to an embodiment of the present disclosure, a semiconductor package is proposed. The semiconductor package comprises a substrate, a plurality of components, an interposer, an electrical interconnect and a package body. The substrate has a first surface and a second surface opposite to the first surface. The plurality of components includes a first component mounted on the first surface of the substrate, and a second component mounted on the second surface of the substrate. The interposer has a first surface. The electrical interconnect connects the first surface of the interposer to the second surface of the substrate. The package body is disposed on the second surface of the substrate and encapsulates the second component mounted on the second surface of the substrate, the electrical interconnect and at least a portion of the interposer.

According to another embodiment of the present disclosure, the semiconductor package comprises a substrate, a first component, a second component, an interposer, an electrical interconnect and a package body. The substrate has an upper surface and a lower surface, the first component is mounted on the upper surface of the substrate, and the second component is mounted on the lower surface of the substrate. The interposer has an upper surface, and the electrical interconnect extends between the upper surface of the interposer and the lower surface of the substrate. The package body is disposed on the lower surface of the substrate and encapsulates the second component, the electrical interconnect and at least a portion of the interposer, where the interposer defines a central opening, and the package body at least partially fills the central opening.

According to another embodiment of the present disclosure, a manufacturing method of forming a semiconductor package is provided. A substrate having a first surface and a second surface opposite to the first surface is provided. A plurality of components is mounted on the second surface of the substrate. An interposer is connected to the second surface of the substrate by at least one electrical interconnect. A package body is formed on the second surface of the substrate to encapsulate the plurality of components mounted on the second surface of the substrate, the electrical interconnect and at least a portion of the interposer, where the interposer defines a gap, and the package body at least partially fills the gap.

BRIEF DESCRIPTION OF THE DRAWINGS

Common reference numerals are used throughout the drawings and the detailed description to indicate the same or similar elements. The present disclosure will be more apparent from the following detailed description taken in conjunction with the accompanying drawings.

DETAILED DESCRIPTION

Figure 1A:
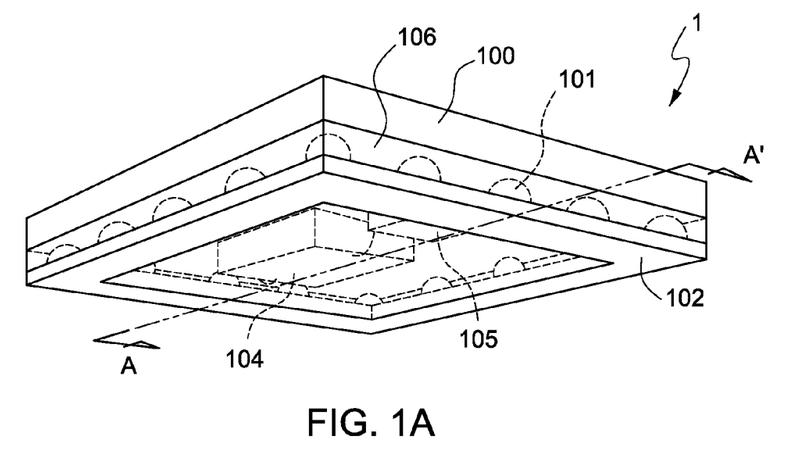
FIG. 1A and FIG. 1B illustrate a semiconductor package structure in accordance with an embodiment of the present disclosure.

FIG. 1A illustrates a perspective view of a semiconductor package structure 1 in accordance with an embodiment of the present disclosure. The semiconductor package structure 1 includes a substrate 100, a semiconductor device 104, passive components 105, solder balls 101, an interposer 102 and a package body 106.

Figure 1B:
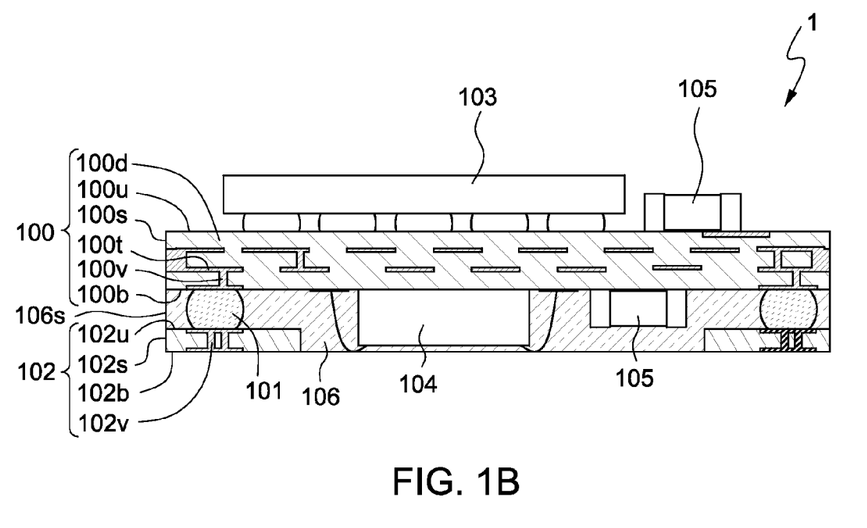

FIG. 1B illustrates a cross-sectional view of the semiconductor package structure 1 taken along line A-A' of FIG. 1A.

The substrate 100 is formed of, for example, a printed circuit board, such as a paper-based copper foil laminate, a composite copper foil laminate, or a polymer-impregnated glass-fiber-based copper foil laminate. The substrate 100 may include a redistribution layer (RDL) for electrical connection between components mounted on a first surface 100u (e.g., an upper surface) and a second surface 100b (e.g., a lower surface) of the substrate 100. The RDL includes a dielectric layer 100d and a number of traces 100t and vias 100v enveloped by the dielectric layer 100d. A portion of one or more of the traces 100t is exposed on the second surface 100b of the substrate 100.

A semiconductor device 103 and at least one passive component 105 are mounted on the first surface 100u of the substrate 100.

The semiconductor device 104 and at least one passive component 105 are mounted on the second surface 100b of the substrate 100.

The semiconductor devices 103 and 104 may be electrically connected to the substrate 100 by flip chip bonding, wire-bonding, or both. The semiconductor devices 103 and 104 also may be implemented as a flip chip package, a wire-bond package, or both. The passive components 105 may be, for example, a capacitor, a resistor, an inductor, or a combination of such components.

The solder balls 101 (or other types of electrical interconnects formed of an electrically conductive material) are mounted to the exposed traces 100t on the second surface 100b of the substrate 100 by using, for example, a ball-planting technique. As shown in FIG. 1A, the solder balls 101 may be arranged in or near the periphery of the second surface 100b of the substrate 100, and each of the solder balls 101 is spaced apart from one another by a distance (corresponding to a pitch) from approximately 50 μm to approximately 200 μm, such as from approximately 50 μm to approximately 100 μm or from approximately 100 μm to approximately 200 μm. The solder balls 101 may have a diameter or a height from approximately 200 μm to approximately 500 μm, such as from approximately 200 μm to approximately 300 μm, from approximately 300 μm to approximately 400 μm, or from approximately 400 μm to approximately 500 μm.

The interposer 102 may include at least one via 102v extending from a first surface 102u (e.g., an upper surface) to a second surface 102b (e.g., a lower surface) of the interposer 102 for electrical connection. The exposed traces 100t on the second surface 100b of the substrate 100 are electrically connected with the vias 102v of the interposer 102 through the solder balls 101. The interposer 102 may include, for example, a printed circuit board, such as a paper-based copper foil laminate, a composite copper foil laminate, or a polymer-impregnated glass-fiber-based copper foil laminate. The interposer 102 and the solder balls 101 may be arranged in or near the periphery of the second surface 100b of the substrate 100. The interposer 102 may have a thickness from approximately 90 μm to approximately 300 μm, such as from approximately 90 μm to approximately 200 μm or from approximately 200 μm to approximately 300 μm.

The solder balls 101 and interposer 102 may provide electrical connections for the semiconductor package structure 1. A sum of the thickness of the interposer 102 and the diameter of one single solder ball 101 is equal to or greater than the height of the highest or thickest component(s) mounted on the second surface 100b of the substrate 100, or is equal to or greater than the height of each component mounted on the second surface 100b of the substrate 100, so as to prevent the components (e.g., the semiconductor device 104 or the passive component 105) mounted on the second surface 100b of the substrate 100 from damage. For example, assuming that the semiconductor device 104 may have greatest thickness/height H among the components on the second surface 100b of the substrate 100, the sum of the thickness of the interposer 102 and the diameter of one single solder ball 101 can be equal to or greater than H. As shown in FIG. 1A and FIG. 1B, the interposer 102 defines a central gap or opening, and the semiconductor device 104 at least partially extends into the central gap or opening defined by the interposer 102.

The package body 106 is disposed on the second surface 100b of the substrate 100, and encapsulates the semiconductor device 104 and the passive component 105 mounted on the second surface 100b of the substrate 100, the solder balls 101 and at least a portion of the interposer 102. As shown in FIG. 1A and FIG. 1B, the package body 106 extends into and fills the central gap or opening defined by the interposer 102, which is not otherwise occupied by the semiconductor device 104. The second surface 102b of the interposer 102 and at least a portion of a lateral surface 102s of the interposer 102 may not be covered or encapsulated by the package body 106. That is, the second surface 102b of the interposer 102 and at least a portion of the lateral surface 102s of the interposer 102 are exposed from the package body 106. In the illustrated embodiment, the sum of the thickness of the interposer 102 and the diameter of one of the solder balls 101 is substantially equal to the height of the package body 106 disposed on the second surface 100b of the substrate 100, where, in the illustrated embodiment, the two values can be deemed to be substantially equal if any difference between the two values is no greater than 10 μm, such as no greater than 8 μm, no greater than 5 μm, or no greater than 1 μm. The package body 106 may include, for example, an epoxy resin having fillers dispersed therein.

In the illustrated embodiment, a lateral surface 106s of the package body 106, a lateral surface 100s of the substrate 100 and the lateral surface 102s of the interposer 102 are substantially coplanar, where, in the illustrated embodiment, the surfaces 106s, 100s, and 102s can be deemed to be substantially coplanar if any displacement between the surfaces 106s, 100s, and 102s is no greater than 10 μm, such as no greater than 8 μm, no greater than 5 μm, or no greater than 1 μm.

Figure 2:
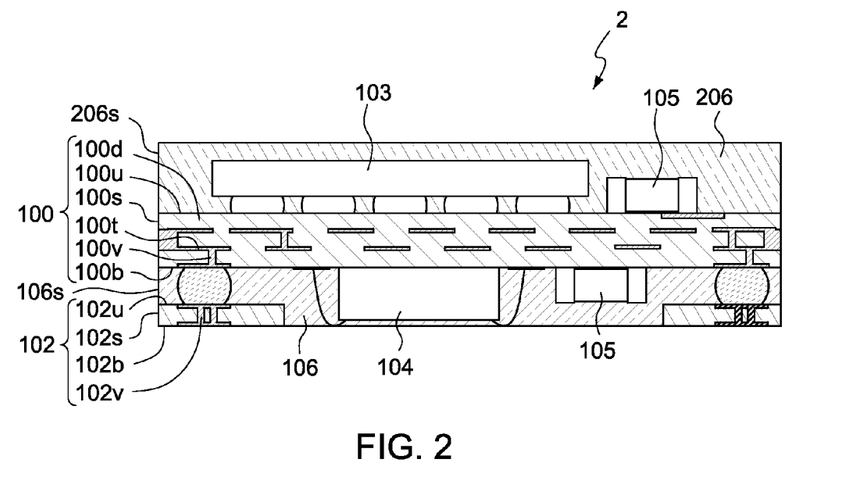
FIG. 2 illustrates a semiconductor package structure in accordance with another embodiment of the present disclosure.

FIG. 2 illustrates a semiconductor package structure 2 in accordance with another embodiment of the present disclosure. The semiconductor package structure 2 is similar to the semiconductor package structure 1 as illustrated and described with reference to FIG. 1A and FIG. 1B, except that the semiconductor package structure 2 further comprises a package body 206.

The package body 206 is disposed on the first surface 100u of the substrate 100, and encapsulates the semiconductor device 103 and the passive component 105 mounted on the first surface 100u of the substrate 100. The package body 206 may include, for example, an epoxy resin having fillers dispersed therein.

In the illustrated embodiment, the lateral surface 100s of the substrate 100, the lateral surface 102s of the interposer 102, the lateral surface 106s of the package body 106 and a lateral surface 206s of the package body 206 are substantially coplanar, where, in the illustrated embodiment, the surfaces 106s, 100s, 102s, and 206s can be deemed to be substantially coplanar if any displacement between the surfaces 106s, 100s, 102s, and 206s is no greater than 10 μm, such as no greater than 8 μm, no greater than 5 μm, or no greater than 1 μm.

Figure 3:
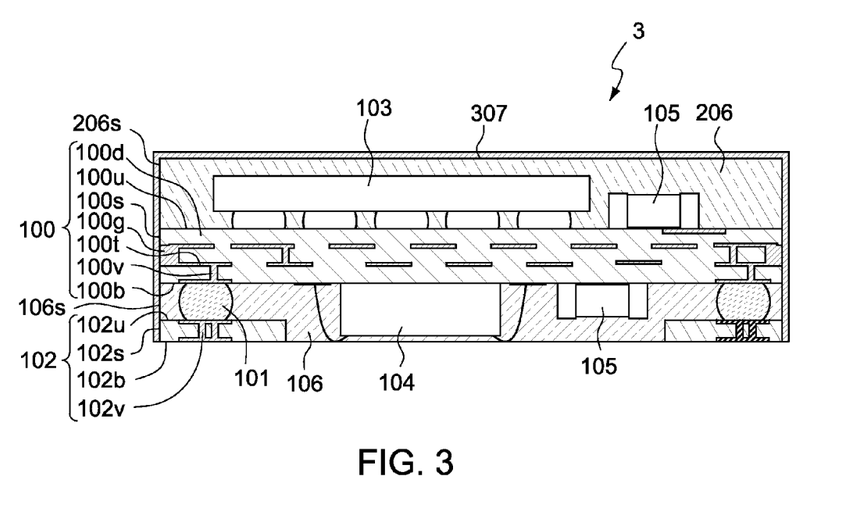
FIG. 3 illustrates a semiconductor package structure in accordance with another embodiment of the present disclosure.

FIG. 3 illustrates a semiconductor package structure 3 in accordance with another embodiment of the present disclosure. The semiconductor package structure 3 is similar to the semiconductor package structure 2 as illustrated and described with reference to FIG. 2, except that the semiconductor package structure 3 further comprises a conformal shield 307.

The conformal shield 307 covers an upper surface of the package body 206, the lateral surface 106s of the package body 106, the lateral surface 100s of the substrate 100, the lateral surface 206s of the package body 206 and the lateral surface 102s of the interposer 102. The lower surface of the package body 106 disposed on the second surface 100b of the substrate and the second surface 102b of the interposer 102 are not covered by the conformal shield 307. The conformal shield 307 may be deposited as a conductive thin film, and may include, for example, aluminum (Al), copper (Cu), chromium (Cr), tin (Sn), gold (Au), silver (Ag), nickel (Ni), stainless steel, or a mixture, an alloy, or other combination thereof. The conformal shield 307 may include a single conductive layer. In accordance with another embodiment of the present disclosure, the conformal shield 307 may include several conductive layers formed of the same material and different materials.

The substrate 100 includes a grounding element 100g, which is disposed adjacent to the lateral surface 100s of the substrate 100. The grounding element 100g is electrically connected to other electrical interconnect included in the substrate 100 and the conformal shield 307 to provide an electrical pathway to reduce EMI. In the illustrated embodiment, the grounding element 100g is implemented as a grounding via and, more particularly, as a remnant of a grounding via in accordance with a set of singulation operations as further described below. Alternatively, the grounding element 100g is a metal trace exposed from the lateral surface 100s of the substrate 100. In the illustrated embodiment, the grounding element 100g is exposed at the lateral surface 100s of the substrate 100, and is in direct or physical contact with the conformal shield 307.

Figure 4:
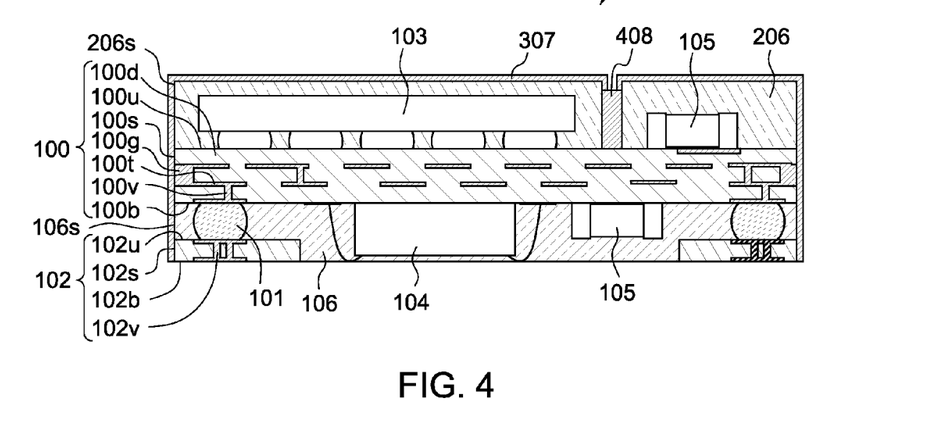
FIG. 4 illustrates a semiconductor package structure in accordance with another embodiment of the present disclosure.

FIG. 4 illustrates a semiconductor package structure 4 in accordance with another embodiment of the present disclosure. The semiconductor package structure 4 is similar to the semiconductor package structure 3 as illustrated and described with reference to FIG. 3, except that the semiconductor package structure 4 further comprises a divider 408.

The divider 408 is disposed on the first surface 100u of the substrate 100 to divide the first surface 100u of the substrate 100 into at least two compartments or regions. The divider 408 is electrically connected to a grounding segment (not illustrated), which is implemented as a pad disposed adjacent to the first surface 100u of the substrate 100 and electrically connected to a grounding segment terminal (not illustrated). The divider 408 is electrically connected to the conformal shield 307. Accordingly, the divider 408 can prevent the components in one region from EMI, noise, or crosstalk generated by the components in another region. The divider 408 can correspond to a metal frame mounted on the first surface 100u of the substrate 100 and may include, for example, copper (Cu), copper-nickel alloy, copper-nickel-zinc alloy, or copper-chromium-nickel alloy. In the illustrated embodiment, the divider 408 is exposed from the package body 206, and is in direct or physical contact with the conformal shield 307.

FIG. 5A, FIG. 5B, FIG. 5C, FIG. 5D, FIG. 5E and FIG. 5F illustrate a semiconductor process in accordance with an embodiment of the present disclosure.

Figure 5A:
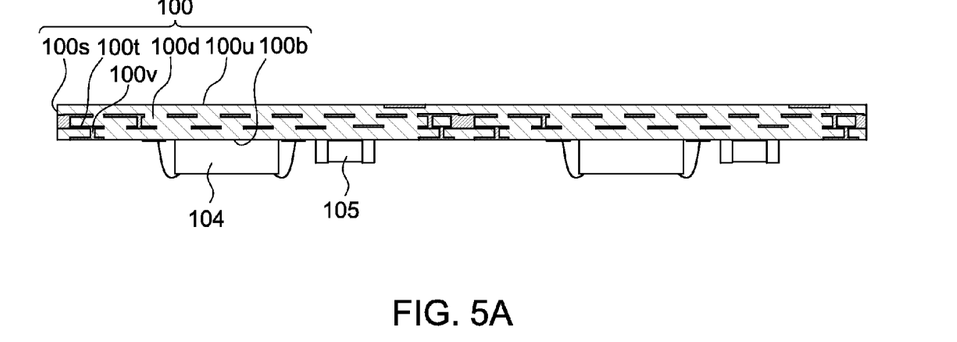
FIG. 5A, FIG. 5B, FIG. 5C, FIG. 5D and FIG. 5E illustrate a manufacturing process in accordance with an embodiment of the present disclosure.

Referring to FIG. 5A, a substrate structure including a plurality of substrates 100 is provided. Each substrate 100 may have a first surface 100u and a second surface 100b opposite to the first surface 100u. A semiconductor device 104 and a passive component 105 are mounted on the second surface 100b of the substrate 100. The substrate 100 may include a redistribution layer (RDL) for electrical connection between components mounted on the first surface 100u and the second surface 100b of the substrate 100. The RDL may include a dielectric layer 100d, and a number of traces 100t and vias 100v enveloped by the dielectric layer 100d. A portion of one or more of the traces 100t is exposed on the second surface 100b of the substrate 100.

Figure 5B:
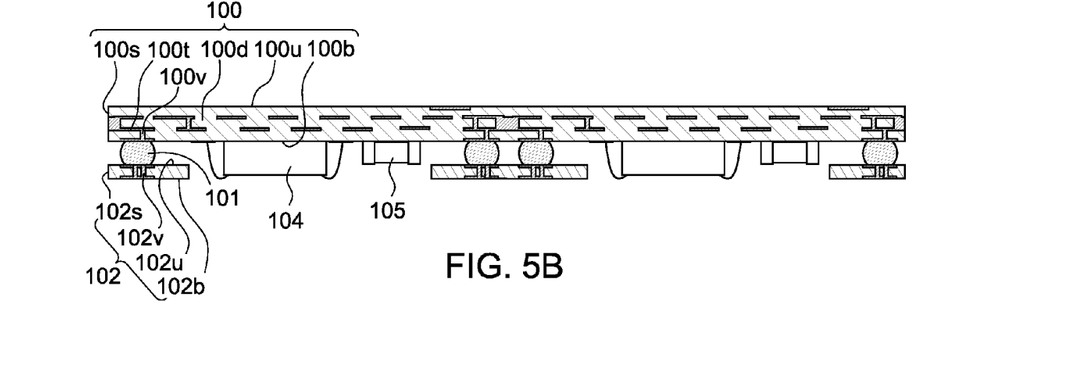

Referring to FIG. 5B, an interposer 102 is electrically connected to the exposed portion of the traces 100t on the second surface 100b of the substrate 100 through solder balls 101. The interposer 102 and the solder balls 101 may be arranged in or near the periphery of the second surface 100b of the substrate 100 as shown in FIG. 1A. The interposer 102 may have a thickness of approximately 250 μm to approximately 1000 μm. The solder balls 101 may have a pitch of approximately 50 μm to approximately 200 μm.

In one embodiment, a plurality of vias 102v of the interposer 102 can be formed by the following operations: (i) drilling via holes to penetrate the interposer 102; (ii) plating a metal on each side surface of the via holes and on portions of a first surface 102u and a second surface 102b of the interposer 102 around the via holes; (iii) filling the via holes with an electrically conductive material and epoxy; and (iv) providing metal caps on the plated portions on the first and second surfaces 102u and 102b of the interposer 102 to cover the via holes.

In another embodiment, the plurality of vias 102v of the interposer 102 can be formed by the following operations: (i) drilling first holes on the first surface 102u of the interposer 102 by a laser beam but not fully penetrating the interposer 102; (ii) drilling second holes on the second surface 102b of the interposer 102 opposite to the first surface 102u by the laser beam, such that the first holes and the corresponding second holes are joined in the interposer 102; and (iii) plating the first holes and the second holes with an electrically conductive material to form the vias 102v.

Figure 5C:
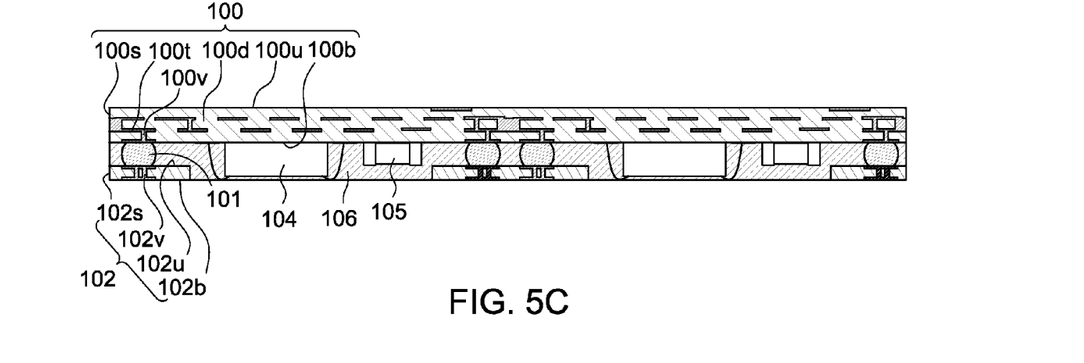

Referring to FIG. 5C, a package body 106 is formed on the second surface 100b of the substrate 100, so as to encapsulate the semiconductor device 104, the passive component 105, the solder balls 101 and at least a portion of the interposer 102. The second surface 102b of the interposer 102 and at least a portion of a lateral surface 102s of the interposer 102 are not encapsulated by the package body 106.

The package body 106 may be formed by a molding technique, such as transfer molding or compression molding. Since a diameter of the solder balls 101 and a distance between the solder balls 101 are well controlled in the present disclosure, an encapsulant, such as epoxy, may be injected through the space defined by the interposer 102 and the solder balls 101 to encapsulate the semiconductor device 104, the passive component 105, the solder balls 101 and at least a portion of the interposer 102.

In one embodiment, the package body 106 may be formed by: (i) placing a buffer layer on top of a highest component of the components mounted on the second surface 100b of the substrate 100, such as the semiconductor device 104, before injecting an encapsulant through spaces between every adjacent pairs of the solder balls 101; and (ii) removing the buffer layer after injection.

Figure 5D:
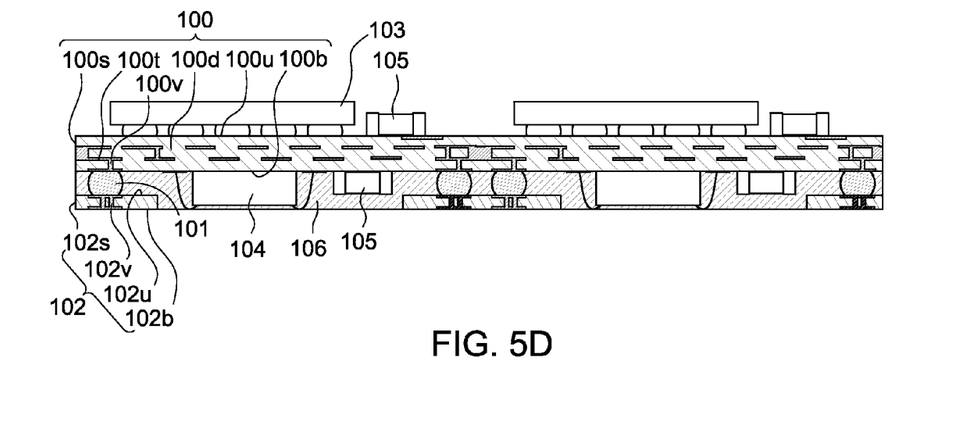

Referring to FIG. 5D, a semiconductor device 103 and a passive component 105 are mounted on the first surface 100u of the substrate 100.

Figure 5E:
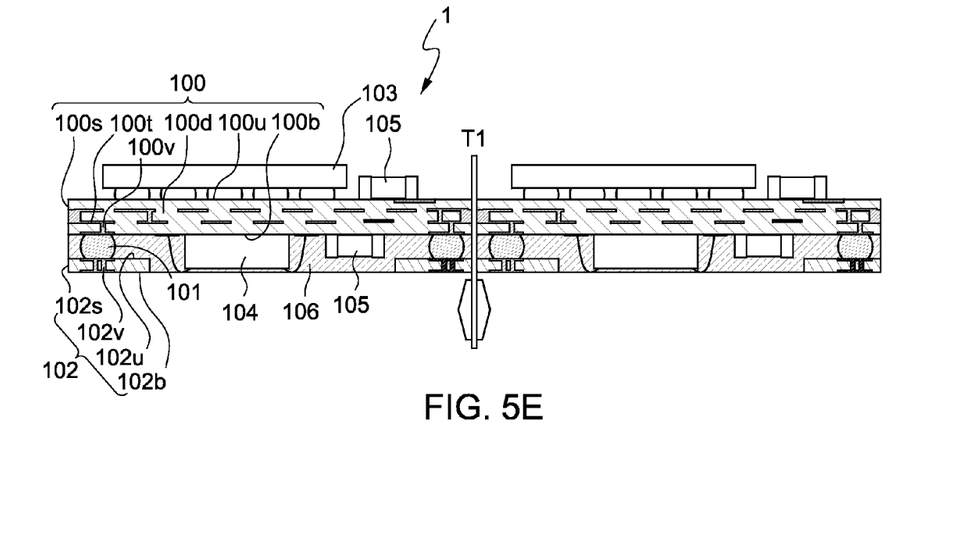

Referring to FIG. 5E, a singulation process is performed to divide a plurality of interconnected semiconductor package structures into individual package structures, including the semiconductor package structure 1 as shown in FIG. 1B. The singulation process is performed using an appropriate laser or other cutting tool, and lateral surfaces 102s, 106s and 100s are thereupon formed on the interposer 102, the package body 106 and the substrate 100, respectively. That is, the singulation path T1 may pass through the interposer 102, the package body 106 and the substrate 100.

Since the interposer 102 is connected with the second surface 100b of the substrate 100 through the solder balls 101 instead of an adhesive material, no buffer space between the components 104 and 105 and the interposer 102 is needed. Accordingly, the semiconductor package structure 1 may be relatively compact compared to a conventional semiconductor package structure.

In addition, the package body 106 may be formed by injecting an encapsulant through the space defined by the interposer 102 and the solder balls 101 to encapsulate the semiconductor device 104, the passive component 105, the solder balls 101 and at least a portion of the interposer 102. Therefore, the components mounted on the second surface 100b of the substrate 100 can be better protected than components in a conventional semiconductor package structure.

Furthermore, the package body 106 may provide a higher thermal conductivity compared to that of air. The heat resulting from the semiconductor devices 103 and 104 and the passive components 105 may be dissipated by the package body 106. In other words, the semiconductor package structure 1 of the present disclosure can have better heat dissipation than a conventional semiconductor package structure.

Figure 6A:
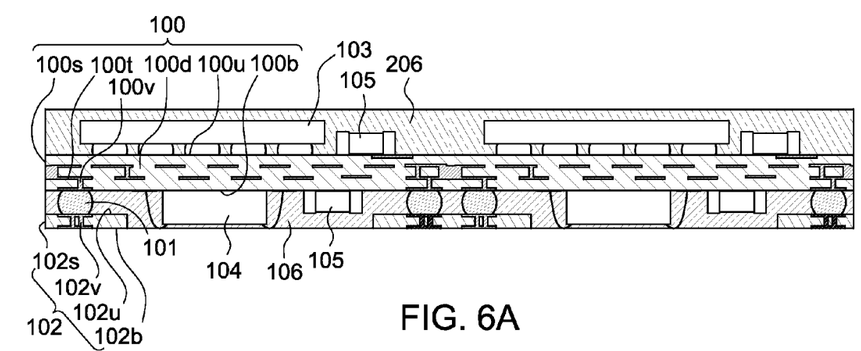
FIG. 6A, FIG. 6B and FIG. 6C illustrate a manufacturing process in accordance with another embodiment of the present disclosure.
Figure 6B:
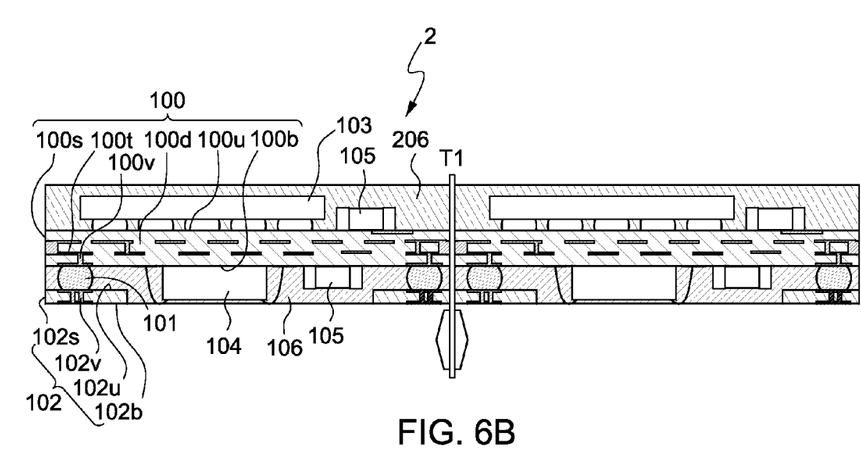
Figure 6C:
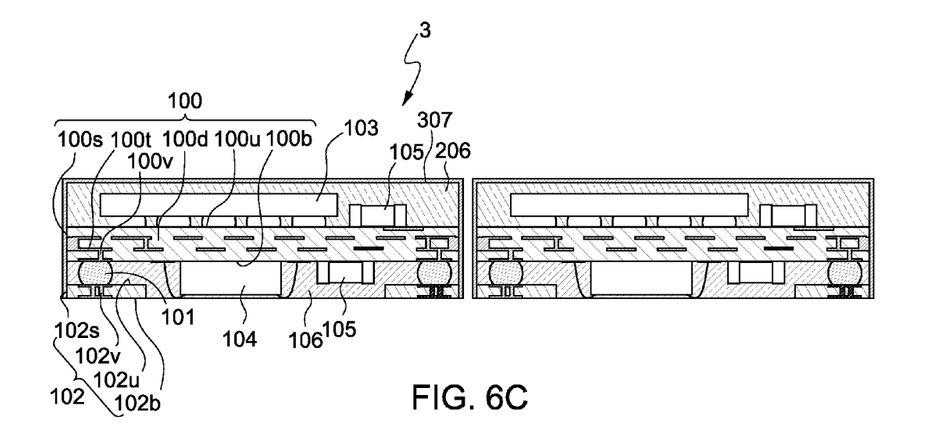

FIG. 6A, FIG. 6B and FIG. 6C illustrate a semiconductor process in accordance with another embodiment of the present disclosure.

Referring to 6A, semiconductor package structures are similar to the semiconductor package structures as described and illustrated with reference to FIG. 5D, except that a package body 206 is formed on the first surface 100u of the substrate 100 after forming the package body 106, so as to encapsulate the semiconductor device 103 and the passive component 105 mounted on the first surface 100u of the substrate 100. The order of forming the package body 106 and the package body 206 can be reversed in other embodiments.

In another embodiment, the semiconductor device 103 and the passive component 105 can be mounted on the first surface 100u of the substrate 100 prior to forming the package body 106 on the second surface 100b of the substrate 100. That is, after the semiconductor devices 103 and 104 and the passive components 105 are mounted on the first surface 100u and the second surface 100b of the substrate 100, an encapsulant is injected through the space between adjacent pairs of solder balls 101 on the second surface 100b of the substrate 100 to form the package body 106 and the package body 206 separately. In another embodiment, the package body 106 on the second surface 100b of the substrate 100 and the package body 206 on the first surface 100u of the substrate 100 are formed simultaneously or in a common operation, and a plurality of through holes (not shown) are formed on the edge of the substrate 100 so that an encapsulant passes through the plurality of through holes and flows to the first surface 100u and the second surface 100b of the substrate 100. In another embodiment, the package body 106 and the package body 206 may be formed by different molding techniques to reduce a substrate warpage. For example, the package body 106 is formed by transfer molding, the package body 206 is formed by compression molding, or vice versa.

Referring to FIG. 6B, a singulation process is performed to divide a plurality of interconnected semiconductor package structures into individual package structures, including the semiconductor package structure 2 as shown in FIG. 2. The singulation process is performed using an appropriate laser or other cutting tool, and lateral surfaces 102s, 106s, 100s and 206s are thereupon formed on the interposer 102, the package body 106, the substrate 100 and the package body 206, respectively. That is, the singulation path T1 may pass through the interposer 102, the package body 106, the substrate 100 and the package body 206.

Referring to FIG. 6C, the semiconductor package structure 3 as shown in FIG. 3 is formed by forming the conformal shield 307 to cover an upper surface of the package body 206, a lateral surface 206s of the package body 206, the lateral surface 100s of the substrate 100, the lateral surface 106s of the package body 106 and the lateral surface 102s of the interposer 102. The conformal shield 307 exposes the lower surface of the package body 106 disposed on the second surface 100b of the substrate 100, and exposes the second surface 102b of the interposer 102. That is, the lower surface of the conformal shield 307 is substantially flush or coplanar with the lower surface of the package body 106, where, in the illustrated embodiment, the lower surfaces can be deemed to be substantially flush or coplanar if any displacement between the surfaces is no greater than 10 μm, such as no greater than 8 μm, no greater than 5 μm, or no greater than 1 μm.

Since the solder balls 101 are encapsulated by the package body 106, the conformal shield 307 does not contact the solder balls 101 during a coating or plating process of forming the conformal shield 307. Accordingly, an EMI impacting the semiconductor devices 103, 104 and passive components 105 may be greatly mitigated by the conformal shield 307. Moreover, the conformal shield 307 may contact a portion of the RDL that electrically connects to a ground layer in the substrate 100, and thus the number of grounding pads on the first surface 100u of the substrate 100 can be reduced.

Figure 7A:
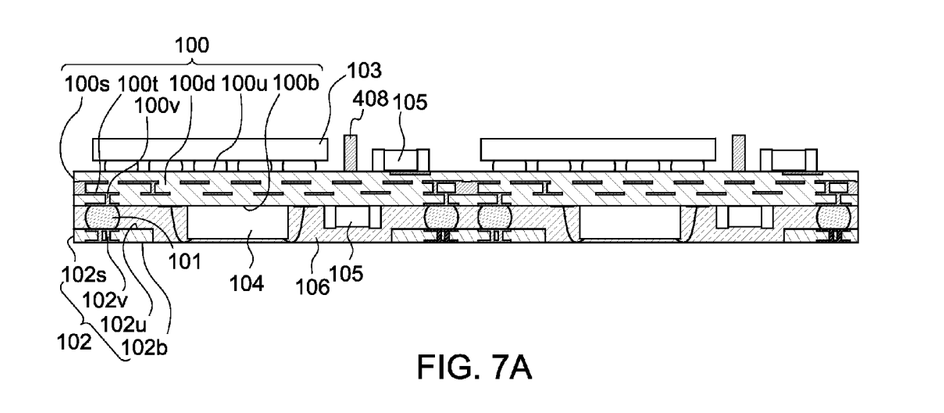
FIG. 7A, FIG. 7B, FIG. 7C and FIG. 7D illustrate a manufacturing process in accordance with another embodiment of the present disclosure.
Figure 7B:
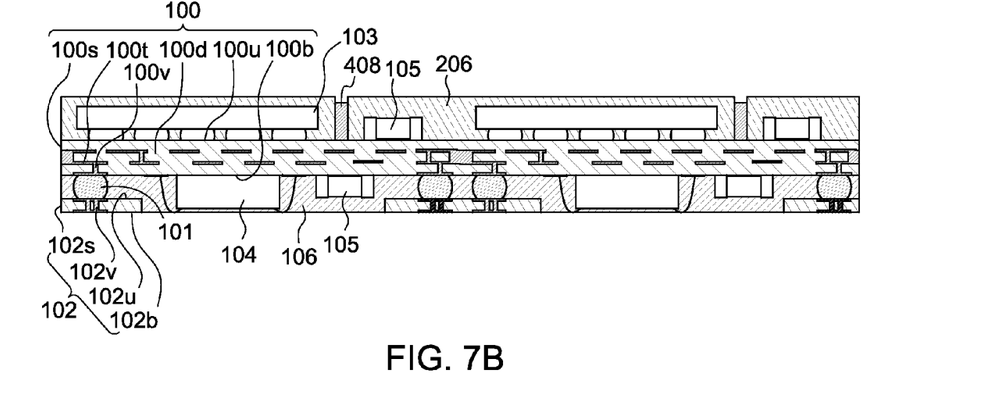
Figure 7C:
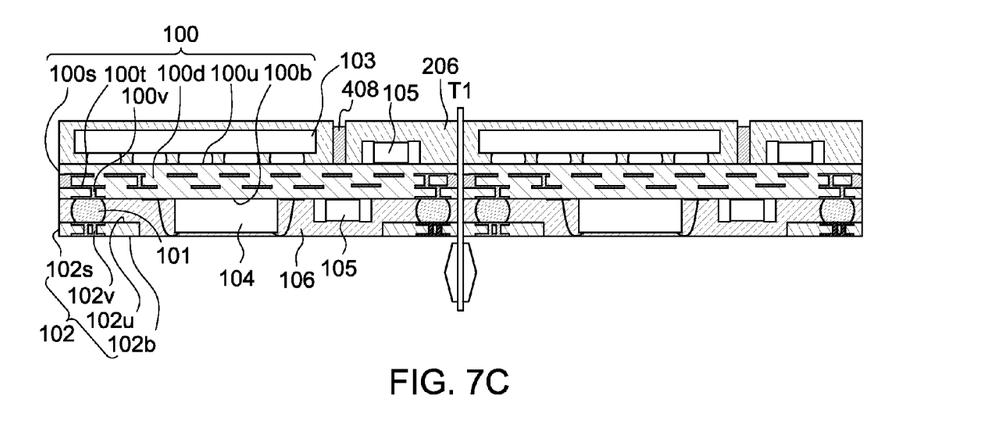

FIG. 7A, FIG. 7B and FIG. 7C illustrate a manufacturing process in accordance with another embodiment of the present disclosure.

Referring to 7A, semiconductor package structures are similar to the semiconductor package structures as described and illustrated with reference to FIG. 5D, except that a divider 408 is disposed or formed on the first surface 100u of the substrate 100 to separate the semiconductor device 103 from the passive component 105, and the divider 408 is electrically connected to a grounding segment, which is implemented as a pad disposed adjacent to the first surface 100u of the substrate 100, such as by an adhesive.

Referring to 7B, a package body 206 is formed on the first surface 100u of the substrate 100, so as to encapsulate the semiconductor device 103, the passive component 105 and at least a portion of the divider 408. An upper surface of the divider 408 is exposed from the package body 206.

Referring to FIG. 7C, a singulation process is performed to divide a plurality of interconnected semiconductor package structures into individual package structures. The singulation process is performed using an appropriate laser or other cutting tool, and lateral surfaces 102s, 106s, 100s and 206s are thereupon formed on the interposer 102, the package body 106, the substrate 100 and the package body 206, respectively. That is, the singulation path T1 may pass through the interposer 102, the package body 106, the substrate 100 and the package body 206.

Figure 7D:
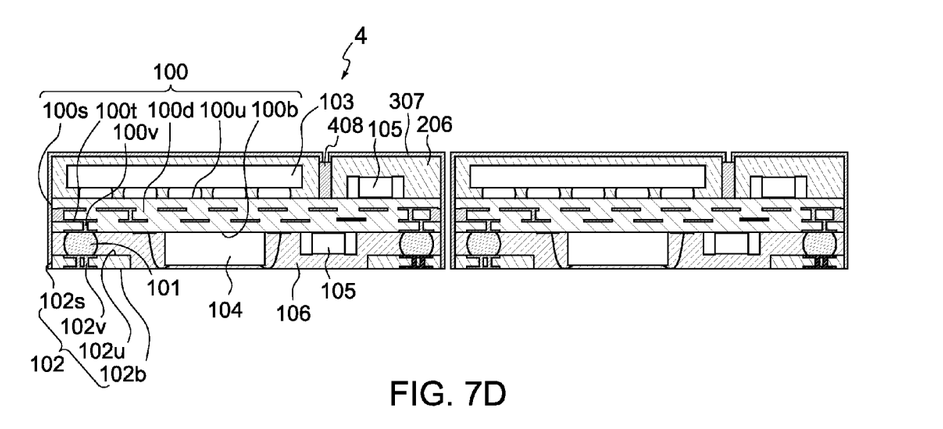

Referring to FIG. 7D, the semiconductor package structure 4 is formed by forming the conformal shield 307 to cover an upper surface of the package body 206 and the lateral surface 206s of the package body 206, the lateral surface 100s of the substrate 100, the lateral surface 106s of the package 106, the lateral surface 102s of the interposer 102 and the upper surface of the divider 408. The lower surface of the package body 106 disposed on the second surface 100b of the substrate 100 and the second surface 102b of the interposers 102 are exposed. The conformal shield 307 is electrically connected to the upper surface of the divider 408.

As used herein, the terms "substantially," "substantial," "approximately," and "about" are used to describe and account for small variations. When used in conjunction with an event or circumstance, the terms can refer to instances in which the event or circumstance occurs precisely as well as instances in which the event or circumstance occurs to a close approximation. For example, the terms can refer to less than or equal to ±10%, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Additionally, amounts, ratios, and other numerical values are sometimes presented herein in a range format. It is to be understood that such a range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations do not limit the present disclosure. It should be understood by those skilled in the art that various changes may be made and equivalents may be substituted without departing from the true spirit and scope of the present disclosure as defined by the appended claims. The illustrations may not be necessarily be drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A semiconductor package, comprising:
   a substrate having a first surface and a second surface opposite to the first surface;
   a plurality of components including a first component mounted on the first surface of the substrate, and a second component mounted on the second surface of the substrate;
   an interposer having a first surface;
   an electrical interconnect connecting the first surface of the interposer to the second surface of the substrate; and
   a first package body disposed on the second surface of the substrate and encapsulating the second component, the electrical interconnect and at least a portion of the interposer;
   wherein a sum of a thickness of the interposer and a height of the electrical interconnect is substantially equal to a height of the first package body; and
   wherein a lateral surface of the substrate, a lateral surface of the interposer, and a lateral surface of the first package body are substantially coplanar.

2. The semiconductor package according to claim 1, wherein the sum of the thickness of the interposer and the height of the electrical interconnect is equal to or larger than a height of the second component mounted on the second surface of the substrate.

3. The semiconductor package according to claim 1, wherein
   the substrate comprises a trace embedded therein, and at least a portion of the trace is exposed on the second surface of the substrate; and
   the interposer comprises a via penetrating the interposer.

4. The semiconductor package according to claim 3, wherein the portion of the trace exposed on the second surface of the substrate is electrically connected with the via of the interposer by the electrical interconnect.

5. The semiconductor package according to claim 1, wherein the interposer defines a central opening, and the first package body at least partially fills the central opening.

6. The semiconductor package according to claim 1, wherein the interposer has a second surface opposite to the first surface of the interposer, and the lateral surface of the interposer extends between the first surface and the second surface of the interposer, wherein the second surface and the lateral surface of the interposer are exposed from the first package body.

7. The semiconductor package according to claim 1, further comprising
   a third component mounted on the first surface of the substrate; and
   a divider disposed on the first surface of the substrate between the first component and the third component.

8. The semiconductor package according to claim 1, further comprising:
   a second package body disposed on the first surface of the substrate and encapsulating the first component mounted on the first surface of the substrate.

9. The semiconductor package according to claim 8, wherein the lateral surface of the substrate, the lateral surface of the interposer, the lateral surface of the first package body and a lateral surface of the second package body are substantially coplanar.

10. The semiconductor package according to claim 9, further comprising:
    a conformal shield covering an upper surface of the second package body, the lateral surface of the first package body, the lateral surface of the second package body, the lateral surface of the substrate and the lateral surface of the interposer.

11. The semiconductor package according to claim 10, further comprising:
    a third component mounted on the first surface of the substrate; and
    a divider disposed on the first surface of the substrate between the first component and the third component, wherein the divider is electrically connected to the conformal shield.

12. The semiconductor package according to claim 1, wherein the interposer defines a central opening, and the second component extends into the central opening.

13. A semiconductor package, comprising:
    a substrate having an upper surface and a lower surface;
    a plurality of first components mounted on the upper surface of the substrate;
    a divider on the upper surface of the substrate to separate at least one of the first components from at least another one of the first components;

a first package body on the upper surface of the substrate to encapsulate the first components and at least a portion of the divider, while exposing an upper surface of the divider;

a second component mounted on the lower surface of the substrate;

an interposer having an upper surface;

an electrical interconnect extending between the upper surface of the interposer and the lower surface of the substrate;

a second package body disposed on the lower surface of the substrate and encapsulating the second component, the electrical interconnect and at least a portion of the interposer, wherein the interposer defines a central opening, and the second package body at least partially fills the central opening; and a conformal shield covering the upper surface of the divider, an upper surface of the first package body, a lateral surface of the first package body, a lateral surface of the substrate, a lateral surface of the second package body and a lateral surface of the interposer;

wherein the conformal shield is electrically connected to the divider.

14. The semiconductor package according to claim 13, wherein the electrical interconnect comprises a solder ball.

15. The semiconductor package according to claim 13, wherein the second component extends into the central opening.

16. The semiconductor package according to claim 13, wherein a sum of a thickness of the interposer and a height of the electrical interconnect is substantially equal to a height of the second package body.

17. The semiconductor package according to claim 13, wherein the conformal shield is a conductive layer.

18. A method of making a semiconductor package, comprising:

providing a substrate having a first surface and a second surface opposite to the first surface;

mounting a plurality of first components on the first surface of the substrate;

disposing a divider on the first surface of the substrate to separate at least one of the first components from at least another one of the first components;

mounting a plurality of second components on the second surface of the substrate;

connecting an interposer to the second surface of the substrate by at least one electrical interconnect;

forming a first package body on the first surface of the substrate to encapsulate the first components and at least a portion of the divider, while exposing an upper surface of the divider;

forming a second package body on the second surface of the substrate to encapsulate the second components, the electrical interconnect and at least a portion of the interposer, wherein the interposer defines a gap, and the second package body at least partially fills the gap; and forming a conformal shield covering the upper surface of the divider, an upper surface of the first package body, a lateral surface of the first package body, a lateral surface of substrate, a lateral surface of the second package body and a lateral surface of the interposer, wherein the conformal shield is electrically connected to the divider.

19. The method of claim 18, further comprising embedding a trace at the second surface of the substrate, a portion of the trace being exposed from the second surface of the substrate.

20. The method of claim 19 wherein the portion of the trace exposed on the second surface of the substrate is electrically connected with the interposer by the electrical interconnect.

21. The method of claim 18, wherein a sum of a thickness of the interposer and a height of the electrical interconnect is substantially equal to a height of the second package body.

22. The method of claim 18, wherein the interposer has a second surface opposite to a first surface of the interposer, and the lateral surface of the interposer extends between the first surface and the second surface of the interposer, wherein the second surface and the lateral surface of the interposer are exposed from the second package body.

23. The method of claim 18, wherein a sum of a thickness of the interposer and a height of the electrical interconnect is equal to or larger than a height of each component of the second components mounted on the second surface of the substrate.

* * * * *